(12) United States Patent
Heikman et al.

(10) Patent No.: US 8,212,290 B2
(45) Date of Patent: Jul. 3, 2012

(54) HIGH TEMPERATURE PERFORMANCE CAPABLE GALLIUM NITRIDE TRANSISTOR

(75) Inventors: Sten Heikman, Goleta, CA (US); Yifeng Wu, Goleta, CA (US)

(73) Assignee: Cree, Inc., Goleta, CA (US)

( * ) Notice: Subject to any disclaimer, the term of this patent is extended or adjusted under 35 U.S.C. 154(b) by 507 days.

(21) Appl. No.: 11/726,975

(22) Filed: Mar. 23, 2007

(65) Prior Publication Data

US 2008/0230786 A1 Sep. 25, 2008

(51) Int. Cl.
*H01L 31/072* (2012.01)
(52) U.S. Cl. ........... 257/195; 257/192; 257/194; 257/24
(58) Field of Classification Search .................. 257/473, 257/192, 194–195, 24
See application file for complete search history.

(56) References Cited

U.S. PATENT DOCUMENTS

| | | | |
|---|---|---|---|
| 4,946,547 A | 8/1990 | Palmour et al. | 156/643 |
| 5,192,987 A | 3/1993 | Khan et al. | 257/183.1 |
| 5,200,022 A | 4/1993 | Kong et al. | 156/612 |
| RE34,861 E | 2/1995 | Davis et al. | |
| 5,393,990 A | 2/1995 | Kohn | |
| 6,004,881 A | 12/1999 | Bozada et al. | |
| 6,046,464 A | 4/2000 | Schetzina | 257/96 |
| 6,064,082 A | 5/2000 | Kawai | |
| 6,071,780 A | 6/2000 | Okamoto et al. | 438/287 |
| 6,177,685 B1 | 1/2001 | Teraguchi et al. | |
| 6,316,820 B1 | 11/2001 | Schmitz et al. | 257/649 |
| 6,586,781 B2 | 7/2003 | Wu et al. | 257/194 |
| 6,720,589 B1 * | 4/2004 | Shields | 257/194 |
| 7,365,374 B2 | 4/2008 | Piner et al. | 257/189 |
| 7,432,142 B2 | 10/2008 | Saxler et al. | 438/167 |
| 2003/0085409 A1 | 5/2003 | Shen et al. | |
| 2004/0159865 A1 * | 8/2004 | Allen et al. | 257/280 |
| 2005/0051796 A1 | 3/2005 | Parikh | |
| 2005/0173728 A1 | 8/2005 | Saxler | |
| 2005/0189561 A1 * | 9/2005 | Kinzer et al. | 257/192 |
| 2005/0253168 A1 * | 11/2005 | Wu et al. | 257/192 |
| 2006/0202272 A1 | 9/2006 | Wu | |
| 2007/0228415 A1 * | 10/2007 | Kanamura et al. | 257/192 |

FOREIGN PATENT DOCUMENTS

| | | |
|---|---|---|
| EP | 1577951 A2 | 3/2005 |
| EP | 1 901 341 | 3/2008 |
| EP | 1 901 342 | 3/2008 |
| JP | 51-129173 | 11/1976 |
| JP | 55-039636 | 3/1980 |
| JP | 07-283140 | 10/1995 |

(Continued)

OTHER PUBLICATIONS

Status of silicon carbide as a wide bandgap semiconductor for high-temperature applications (Casady et al., Solid State electronic, vol., 39, No. 10, pp. 1409-1422, 1996.*

(Continued)

*Primary Examiner* — Samuel Gebremariam
(74) *Attorney, Agent, or Firm* — Koppel, Patrick, Heybl & Philpott

(57) ABSTRACT

A transistor device capable of high performance at high temperatures. The transistor comprises a gate having a contact layer that contacts the active region. The gate contact layer is made of a material that has a high Schottky barrier when used in conjunction with a particular semiconductor system (e.g., Group-III nitrides) and exhibits decreased degradation when operating at high temperatures. The device may also incorporate a field plate to further increase the operating lifetime of the device.

27 Claims, 4 Drawing Sheets

FOREIGN PATENT DOCUMENTS

| | | |
|---|---|---|
| JP | 08-255898 | 10/1996 |
| JP | 09-307097 | 11/1997 |
| JP | 09-321307 | 12/1997 |
| JP | 10-223901 | 8/1998 |
| JP | 10-308351 | 11/1998 |
| JP | 11-261052 | 9/1999 |
| JP | 2000-174260 | 6/2000 |
| JP | 2000-252458 | 9/2000 |
| JP | 2001-007325 | 1/2001 |
| JP | 2001-077415 | 3/2001 |
| JP | 2001-098369 | 4/2001 |
| JP | 2002-076024 | 3/2002 |
| JP | 2002-77353 | 3/2002 |
| JP | 2005-086171 | 3/2005 |
| WO | WO00/04587 | 1/2000 |
| WO | WO 2005/114743 A | 12/2005 |
| WO | WO2005114743 A2 | 12/2005 |
| WO | WO 2006/098801 A1 | 9/2006 |

OTHER PUBLICATIONS

Official Rejection of Japanese Patent Application No. 2003-535260, dated: Jun. 19, 2009.
Patent Abstracts of Japan, Pub. 10-223901, Pub. Date: Aug. 21, 1998.
Khan et al., "AlGaN/GaN Metal-Oxide-Semiconductor Heterostructure Field-Effect Transistors on SiC Substrates", Applied Physics Letters Vo. 77, No. 9, Aug. 2000, pp. 1339-1341.
Examination Report re European Application No. 02 792 174.1-1235, Dated Oct. 7, 2008.
Related Extended European Search Report re European Application No. 08250197.4-1235/1973163, Dated: Nov. 6, 2008.
Xing, "High Breakdown Voltage ALGAN-GAN HEMTS Achieved by Multiple Field Plates", IEEE Electron Device Letters,vol. 25, No. 4, Apr. 2004, pp. 161-163.
Examination Report from related European Patent Application No. 02769655.8-1235, Dated: Nov. 3, 2008.
Second Office Action from related China Application No. 02818502. 1., Dated: Feb. 19, 2009.
Examination Report from related European Patent Application No. 06851411.6-2203, dated: Jan. 26, 2009.
"Enhancement of Base Conductivity Via the Piezoelectric Effect in AlGaN/GaN HBTs", Asbeck et al., Aug. 18, 1999, Solid State Electronics 44 (2000) 211 219, pp. 211-219.
"New UV Light Emitter based on AlGaN Heterostructures with Graded Electron and Hole Injectors", Johnson et al., XP-002505432, Mat. Res. Soc. Symp. Proc. vol. 743, 2003, Materials Research Society, pp. 1.2.4.1-1.7.4.6.
"Polarization-Induced 3-Dimensional Electron Slabs in Graded AlGaN Layers", Simon et al., XP-002505433, Mater. Res. Soc. Symp. Proc. vol. 892, 2006 Materials Research Society,pp. 1-6.
Examiner's Report from related Canada Patent Application No. 2,399,547, Dated: Mar. 4, 2009.
B. Gelmont, et al., "Monte Carlo Simulation of Electron Transport in Gallium Nitrate", Journal of Applied Physics, vol. 74, Issue 3, Aug. 1, 2993 p. 1818-1821.
Wu et al., "High A1-Content AlGaN/GaN HEMTs on SiC Substrates With Very-High Power Performance", IEDM pp. 925-927, Dec. 1999.
S. Karmalkar, et al. "Very High Voltage AlGaN/GaN High Electron Mobility Transistors Using a Field Plate Deposited on a Stepped Insulator", Solid State Electronics vol. 45, 2001 pp. 1645-1662.
Wu, et al., "Bias-Dependent Performance of High-Power AlGaN/GaN HEMTs", IEDM 2001, Washington DC, Dec. 2-6, 2001.
Lu, "AlGaN/GaN HEMTS on SiC With Over 100 GHz fT and Low Microwave Noise", IEEE Transactions on Electron Devices, vol. 48, No. 3 Mar. 2001, pp. 581-585.
Gaska et al. "Electron Transport in AlGaN-GaN Heterostructures Grown on 6H-SiC Substrates", Appl. Phys. Lett. 72, Feb. 1998, pp. 707-709.
Result of Examination for related Korean Application No. 10-2004-7001027, Dec. 15, 2009.
IEEE Electron Device Letters, vol. 21, No. 2, Feb. 2000, pp. 63-65, "AlGaN/GaN Metal Oxide Semiconductor Heterostructure Field Effect Transistor,", M. Asif Khan et al.
Japanese Publication No. Hei 11-224881, Aug. 17, 1999, Compound Semiconductor Apparatus.
IEEE Electron Device Letters, vol. 21, No. 9, Sep. 2000, pp. 421-423, "High Breakdown GaN HEMT with Overlapping Gate Structure," N.-Q. Zhang et al.
Related European Examination Report for European Patent Application No. 02769655.8, dated: Dec. 8, 2008.
Related Office Action from Japanese Patent Office re Japanese Patent Application No. 2002-590421, dated: Oct. 21, 2008.
Japanese Patent Application Public Disclosure 2000-68498, Date: Mar. 3, 2000.
Japanese Patent Application Public Disclosure 2001-77353, dated Mar. 23, 2001.
PCT Notification of Transmittal of International Preliminary Examination Report for related PCT Application No. PCT/US06/26405, dated: Jan. 20, 2010.
(From related application) European Office Action, Patent Application No. 07253716.0 dated Jan. 26, 2010.
Okamoto Y. et al. "A 149W Recessed-Gate AlGaN/GaN FP-FET", Microwave Symposium Digest, vol. 3, Jun. 6, 2004, p. 1351-1354.
From related application: European Office Action, Patent Application No. 02792174.1 dated Mar. 8, 2010.
From related application: European Office Action, Patent Application No. 02769655.8 dated Mar. 3, 2010.
Office Action from related U.S. Appl. No. 11/904,064, mailed: Nov. 19, 2009.
Office Action from related U.S. Appl. No. 11/356,791, mailed: Apr. 7, 2010.
Examiner's Report for Canadian Patent Application No. 2,447,058 dated Dec. 15, 2009.
Response to Office Action from U.S. Appl. No. 11/904,064, Dated: Feb. 19, 2010.
Office Action from U.S. Appl. No. 11/356,791, Dated: Apr. 7, 2010.
Response to Office Action from U.S. Appl. No. 11/356,791, Dated May 25, 2010.
Office Action from U.S. Appl. No. 11/904,064, Dated: May 19, 2010.
Office Action from U.S. Appl. No. 11/356,791, Dated: Jun. 11, 2010.
Final Official Notice of Rejection from Japanese Patent Application No. 2003-535260 mailed Jun. 8, 2010.
Official Notice of Rejection from Japanese Patent Application No. 2009-243336 mailed Jun. 8, 2010.
Official Notice of Rejection from Japanese Patent Application No. 2009-243337 mailed Jun. 8, 2010.
Invitation to Submit Applicant's Opinion and Examiner's Report to the Board, in Japanese Patent Application No. 2002-590421, Appeal Filing No. 2009-000996 dated Oct. 12, 2010.
Final Notice of Reasons for Rejection (Summary) for Japanese Patent Application No. 2003-535260 dated Nov. 2, 2010.
Final Notice of Reasons for Rejection (Summary) for Japanese Patent Application No. 2009-243336 dated Nov. 2, 2010.
Decision of Rejection (Summary) for counterpart Japanese Patent Application No. 2009-243337 dated Nov. 2, 2010.
Extended Search Report for European Patent Application No. 10187940.1 dated Feb. 8, 2011.
Lu, W., et al., "P-Type SiGe Transistors with Low Gate Leakage Using SiN Gate Dielectric", IEEE Electron Device Letters, IEEE Inc., New York, US vol. 20, No. 10, Oct. 1999, pp. 514-516 (XP000890470).
Zhang, N-Q, et al., "High Breakdown GaN HEMT with Overlapping Gate Structure", IEEE Electronc Device Letters, IEEE, Inc., New York, US, vol. 21, No. 9, Sep. 2000, pp. 373-375, XP000954354.
Tilak, V., et al., "Effect of Passivation on AlGaN/GaN HEMT Device Performance", 2000IEEE International Symposium on Compound Semiconductors, Proceedings of the IEEE Twenty-Seventh International Symposium on Compound Semiconductors (Cat. No. 00TH8498), 2000 IEEE International Symposium on Compound Semiconductors Proceedings of TH, 2000, p. 357-363, XP002239700, Piscataway, NJ, USA, IEEE, USA.
Office Action from Japanese Patent Application No. 2001-557092 mailed Feb. 18, 2011.

Chan, YiJen, "Ga0.51In0.49P/GaAs HEMTs Exhibiting Good Electric Performance at Cryogenic Temperatures", IEEE Transations on Electron Devices 37 Oct. 1990, No. 10, New York.

Vetter M., "Surface Passivation of Silicon by rf Magnetron-Sputtered Silicon Nitride Films", Thin Solid Films, V. 337 (1999) 118-122 (1999).

Extended Search Report for European Patent Application No. 10187943.5 dated Feb. 18, 2011.

Sugimoto, I., "Tensilely-Stressed SiN Films Reactively Sputtered in KR-N2 Plasmas for Producing Free-Standing Devices", Thin Solid Films, Elsevier-Sequoia S.A. Lausanne, CH, vol. 268, No. 1/02, Nov. 1, 1995, pp. 152-160, XP000623616.

Extended European Search Report for European Patent Application No. 10189898.9 dated Mar. 24, 2011.

Eastman, L. F., "Undoped AlGaN/GaN HEMTs for Microwave Power Amplification", IEEE Transactions on Electron Devices, IEEE Inc. New York, US, vol. 48, No. 3, Mar. 2001, pp. 479-485.

Wu, Y-F, "High AL-Content AlGaN/GaN MODFETs for Ultrahigh Performance", IEEE Electron Devices Letters, IEEE Inc. New York, US, vol. 19, No. 2, Feb. 1, 1998, pp. 50-53.

Extended Search Report for European Patent Application No. 10189899.7 dated Mar. 25, 2011.

Office Action from Canadian Patent Application No. 6,064,082 dated May 16, 2000.

Extended Search Report from European Patent Application No. 11153385.7 dated Apr. 28, 2011.

Extended Search Report from European Patent Application No. 11153386.5 dated Apr. 29, 2011.

Cai Y., et al., "High-Performance Enhancement-Mode AlGaN/GaN HEMTs Using Fluoride-Based Plasma Treatment", IEEE Electron Device Letters, IEEE Service Center, NY, NY US vol. 26, No. 7, Jul. 2005 pp. 435-437, XP011135432.

Notice of Reasons for Rejection in Japanese Patent Application No. 2003-535260 mailed Apr. 26, 2011.

S. Imanaga et al., "Novel AlN/GaN Insulated Gate Heterostructure Field Effect Transistor with Modulation Doping and One-Dimensional Simulation of Charge Control", J. Appl. Phys. US, American Institute of Physics, Dec. 1, 1997, vol. 82 No. 11, p. 5843-5858.

Final Notice of Reasons for Rejection for Japanese Patent Application No. 2009-243336 mailed Apr. 26, 2011.

Notice of Reasons for Rejection for Japanese Patent Application No. 2009-243337 mailed Apr. 26, 2011.

Response to Office Action U.S. Appl. No. 11/904,064, dated: May 19, 2010, filed Oct. 19, 2010.

Response to Office Action U.S. Appl. No. 11/356,791, dated: Apr. 7, 2010, filed Jul. 2, 2010.

Office Action from U.S. Appl. No. 12/581,977, dated: Sep. 16, 2010.

Extended European Search Report, for related European Application No. 07253716.0, Dated: Jun. 25, 2009.

Examination Report re related European Application No. 01 905 364.4, dated: Jun. 24, 2009.

B. Gelmont, at al., "Monte Carlo Simulation of Electron Transport in Gallium Nitrate", Journal of Applied Physics, vol. 74, Issue 3, Aug. 1, 2993 p. 1818-1821.

Gaska, et al. "High Temperature Performance of ALGAN/GAN HFET's on Sic Substrates", IEEE Electron Device Letters vol. 18, No. 10, Oct. 1997, p. 492-494.

Wu et al., "High Al-Content AlGaN/GaN HEMTs on SiC Substrates With Very-High Power Performance", IEDM pp. 925-927, Dec. 1999.

S. Karmalkar, at al. "Very High Voltage AlGaN/GaN High Electron Mobility Transistors Using a Field Plate Deposited on a Stepped Insulator", Solid State Electronics vol. 45, 2001 pp. 1645-1662.

Wu, et al., "30-W/Mm Gan Hemts by Field Plate Optimization", IEEE vol. 25, No. 3, Mar. 2004, pp. 117-119.

Wu, at al., "Bias-Dependent Performance of High-Power AlGaN/GaN HEMTs", IEDM 2001, Washington DC, Dec. 2-6, 2001.

Lu, "AlGaN/GaN Hemts on Sic With Over 100 GHz fT and Low Microwave Noise", IEEE Transactions on Electron Devices, vol. 48, No. 3 March 2001, pp. 581-585.

Gaska et al. "Electron Transport in AlGaN-GaN Heterostructures Grown on 6H-SiC Substrates", Appl. Phys. Lett. 72, Feb. 1998, pp. 707-709.

Office Action for family related U.S. Appl. No. 11/799,786, dated Sep. 8, 2008.

Office Action for family related U.S. Appl. No. 11/356,791, dated: Sep. 2, 2008.

First Examination Report from related European Patent Application No. 08250197.4, dated: Jul. 28, 2009.

Office Action from U.S. Appl. No. 13/014,619, dated: Aug. 5, 2011.
Office Action from U.S. Appl. No. 11/356,791, dated: Nov. 4, 2011.
Office Action from U.S. Appl. No. 12/554,803, dated: Nov. 4, 2011.
Office Action from U.S. Appl. No. 11/356.791. dated: Apr. 6, 2012.
Office Action for Canadian Patent Application No. 2,454,269 dated Aug. 26, 2011.

Summary of Decision of Rejection for Japanese Patent Application No. 2003-535260 mailed Aug. 30, 2011.

Summary of "Decision of Rejection" for Japanese Patent Application No. 2009-243336 mailed Aug. 30, 2011.

Summary of "Decision to Dismiss the Amendment" for Japanese Patent Application No. 2009-243336 mailed Aug. 30, 2011.

Decision of Final Rejection for Japanese Patent Application No. 2001-557092 dated Sep. 15, 2011.

Summary of "Notice of Reasons for Rejection" for counterpart Japanese Patent Application No. 2008-013133 mailed Dec. 6, 2011.

Saburo Nagakura et al. edited, Iwanami Physical and Chemical Dictionary, Japan, Iwanami Shoten, Apr. 24, 1998, fifth edition, p. 992, "nichrome".

Summary of Reasons for Rejection for Japanese Patent Application No. 2007-245497 mailed Dec. 6, 2011.

EPO Examination Report for European Patent Application No. 02769655.8 dated Jan. 18, 2012.

* cited by examiner

HIGH TEMPERATURE PERFORMANCE CAPABLE GALLIUM NITRIDE TRANSISTOR

This invention was made with Government support under Contract No. DARPA FA8650-04-C-7146. The Government has certain rights in this invention.

BACKGROUND OF THE INVENTION

1. Field of the Invention

The invention relates to transistors, and more particularly to transistors designed to operate efficiently at high temperatures.

2. Description of the Related Art

Improvements in the manufacturing of AlGaN/GaN semiconductor materials have helped advance the development of AlGaN/GaN transistors, such as high electron mobility transistors (HEMTs) for high frequency, high temperature and high power applications. AlGaN/GaN has large bandgaps, high peak and saturation electron velocity values [B. Gelmont, K. Kim and M. Shur, *Monte Carlo Simulation of Electron Transport in Gallium Nitride*, J. Appl. Phys. 74, (1993), pp. 1818-1821]. AlGaN/GaN HEMTs can also have 2DEG sheet densities in excess of 1013 cm-2 and relatively high electron mobility (up to 2019 cm2/Vs) [R. Gaska, et al., *Electron Transport in AlGaN—GaN Heterostructures Grown on 6H—SiC Substrates*, Appl. Phys. Lett. 72, (1998), pp. 707-709]. These characteristics allow AlGaN/GaN HEMTs to provide very high voltage and high power operation at RF, microwave and millimeter wave frequencies.

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., *High-Temperature Performance of AlGaN/GaN HFET's on SiC Substrates*, IEEE Electron Device Letters, 18, (1997), pp. 492-494; and Wu et al. "High Al-content AlGaN/GaN HEMTs With Very High Performance", IEDM-1999 Digest, pp. 925-927, Washington, D.C., December 1999. Some of these devices have shown a gain-bandwidth product (fT) as high as 100 gigahertz (Lu et al. "AlGaN/GaN HEMTs on SiC With Over 100 GHz ft and Low Microwave Noise", IEEE Transactions on Electron Devices, Vol. 48, No. 3, March 2001, pp. 581-585) and high power densities up to 10 W/mm at X-band (Wu et al., "Bias-dependent Performance of High-Power AlGaN/GaN HEMTs", IEDM-2001, Washington, D.C., Dec. 2-6, 2001).

Electron trapping and the resulting difference between DC and RF characteristics have been a limiting factor in the performance of these devices. Silicon nitride (SiN) passivation has been successfully employed to alleviate this trapping problem resulting in high performance devices with power densities over 10 W/mm at 10 Ghz. For example, U.S. Pat. No. 6,586,781, which is incorporated herein by reference in its entirety, discloses methods and structures for reducing the trapping effect in GaN-based transistors. However, due to the high electric fields existing in these structures, charge trapping is still an issue.

Field plates have been used to enhance the performance of GaN-based HEMTs [See S Kamalkar and U. K. Mishra, *Very High Voltage AlGaN/GaN High Electron Mobility Transistors Using a Field Plate Deposited on a Stepped Insulator*, Solid State Electronics 45, (2001), pp. 1645-1662]. Recently, field plate optimization for operation at microwave frequencies has resulted in drastically improved power densities exceeding 30 W/mm at 4 and 8 GHz [Wu et al, 30 *W/mm GaN HEMTs by field plate optimization*, IEEE Electron Device Letters, Vol. 25, No. 3, March 2004]. However, the reliability of these devices is still an issue, especially at high operation temperatures.

SUMMARY OF THE INVENTION

The present invention provides transistors that operate efficiently at high temperatures and exhibit low degradation over time. One embodiment of a transistor device according to the present invention comprises an active region comprising a plurality of semiconductor layers. Source and drain electrodes are formed in contact with the active region. A gate electrode is formed on the active region between the source and drain electrodes. The gate comprises a contact portion made from a material having a high Schottky barrier and exhibiting low degradation at high operating temperatures. The contact portion is disposed to contact the active region. A spacer layer is formed on at least part of the surface of the active region between the source and drain electrodes.

One embodiment of a field effect transistor (FET) according to the present invention comprises an active region comprising a plurality of semiconductor layers. Drain and source electrodes are formed in contact with the active region. A gate electrode is formed on the active region between the source and drain electrodes. The gate comprises a contact portion made from a material having a high Schottky barrier and exhibiting low degradation at high operating temperatures. The contact portion is disposed to contact the active region. First and second spacer layers are formed. The first spacer layer covers at least part of the surface of the active region. The second spacer layer covers the gate electrode and at least part of the first spacer layer. A field plate is disposed on the second spacer layer.

One embodiment of a Group-III nitride transistor device according to the present invention comprises an active region comprising a plurality of active semiconductor layers. A source electrode is formed in contact with the active region. A drain electrode is formed in contact with the active region. A gate electrode is formed on the active region between the source and drain electrodes. The gate comprises a contact portion made from a material selected from the group consisting of platinum (Pt), tungsten (W), molybdenum (Mo), chromium (Cr), and nickel-chromium alloys (NiCr). At least one spacer layer is disposed on at least part of the surface of the active region between the source and drain electrodes.

Another embodiment of a Group-III nitride transistor device according to the present invention comprises an active region comprising a plurality of active semiconductor layers. A source electrode is formed in contact with the active region. A drain electrode is formed in contact with the active region. A gate electrode is formed on the active region between the source and drain electrodes. The gate comprises a contact portion made from polycrystalline indium nitride (InN). At least one spacer layer is disposed on at least part of the surface of the active region between the source and drain electrodes.

DETAILED DESCRIPTION OF THE INVENTION

Figure 1:
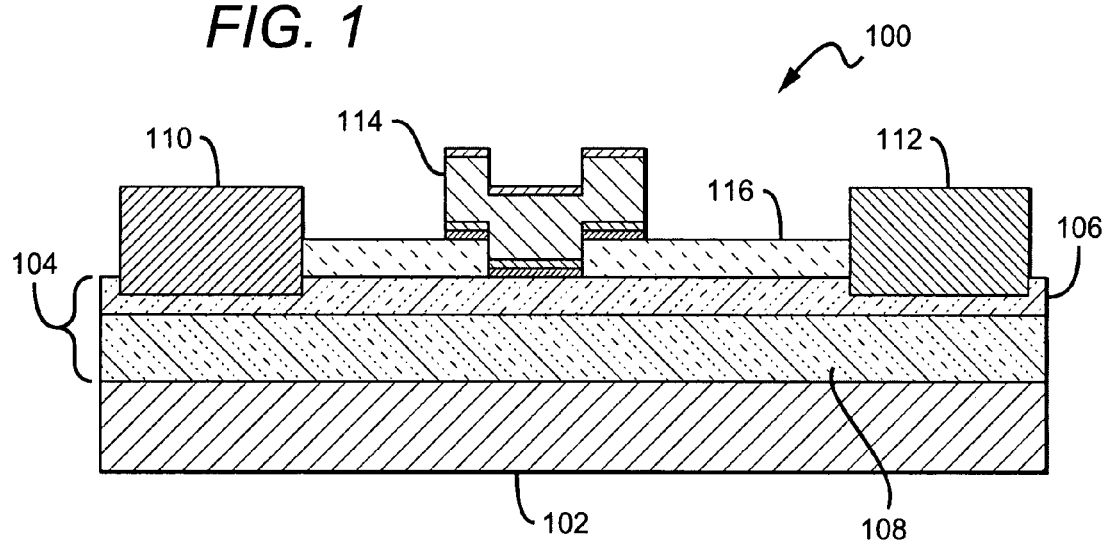
FIG. 1 is a sectional view of one embodiment of a transistor device according to the present invention.

The structure and composition of the transistor gate according to the present invention can be used with many different transistor structures, such as high electron mobility transistors (HEMTs). Transistors generally include an active region having a plurality of semiconductor layers, one of which is a channel layer. Metal source and drain electrodes are formed in contact with the active region, and a gate is formed on the active region between the source and drain electrodes for modulating electric fields within the active region. In one embodiment, a first non-conductive spacer layer is formed above the active region, over at least a portion of the surface of the active region between the source and the drain. In another embodiment, a second non-conductive spacer layer is formed over at least a portion of the first spacer layer and the gate electrode, and a field plate is disposed on the second spacer layer. The spacer layers can comprise a dielectric layer or a combination of multiple dielectric layers, and in certain embodiments other materials such as epitaxially grown layers.

In one embodiment, a conductive field plate is formed on the second spacer layer with the spacer layer providing isolation between the field plate the active region below. The field plate extends a distance on the spacer layer from the edge of the gate toward the drain electrode, and can extend a distance on the spacer layer toward the source electrode. The field plate can be electrically connected to either the source electrode or the gate. The field plate arrangement can reduce the peak electric field in the device, resulting in increased breakdown voltage and reduced trapping. The reduction of the electric field can also yield other benefits such as reduced leakage currents and enhanced reliability. Additional spacer layer and field plate pairs can also be included.

The gate electrode can be made of several materials that have a high Schottky barrier corresponding to a specific semiconductor system (e.g., GaN or AlGaN) and exhibit low degradation at high operating temperatures. In the GaN semiconductor system, a high Schottky barrier is considered to be any barrier height in excess of 0.4 eV, with a preferred barrier height in excess of 0.45 eV. Low degradation at high operating temperatures means that the RF output power of the device degrades by no more than 0.5 dB after the device has been operated for 100 hours at 350° C. Various materials have these characteristics when used in certain semiconductor systems. For example, gate electrodes that have certain nickel-chromium alloys (NiCr) as the gate contact metal exhibit improved durability at high operating temperatures. Other materials have exhibited similar results as discussed below.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIG. 1 shows one embodiment of a transistor device 100 according to the present invention that is preferably Group-III nitride based, although other material systems can also be used. Group-III nitrides refer to those semiconductor compounds formed between nitrogen and the elements in the Group-III of the periodic table, usually aluminum (Al), gallium (Ga), and indium (In). The term also refers to ternary and tertiary compounds such as AlGaN and AlInGaN.

The transistor device 100 can comprise a substrate 102 which can be made from silicon carbide, sapphire, spinet, ZnO, silicon, gallium nitride, aluminum nitride, or any other material or combinations of materials capable of supporting growth of a Group-III nitride material. In some embodiments the substrate is eliminated from the finished transistor device.

Substrate 102 can be made of many different materials with a suitable substrate being a 4H polytype of silicon carbide, although other silicon carbide polytypes can also be used including 3C, 6H and 15R polytypes. Silicon carbide has a very high thermal conductivity so that the total output power of Group-III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree, Inc., of Durham, N.C. and methods for producing them are set forth in the scientific literature as well as in a U.S. Pat. Nos. Re. 34,861; 4,946,547; and 5,200,022.

The transistor device 100 comprises an active region 104. The active region 104 comprises a barrier layer 106 and a plurality of semiconductor layers 108. The plurality of semiconductor layers 108 can include a nucleation layer (not explicitly shown) formed on the substrate 102 to reduce the lattice mismatch between the substrate 102 and the next layer in the transistor device 100. The nucleation layer should be approximately 1000 angstroms (Å) thick, although other thicknesses can be used. The nucleation layer can comprise many different materials, with a suitable material being $Al_zGa_{1-z}N$ ($0<=z<=1$), and can be formed on the substrate 102 using known semiconductor growth techniques such as Metal Organic Chemical Vapor Deposition (MOCVD), Hydride Vapor Phase Epitaxy (HVPE), or Molecular Beam Epitaxy (MBE).

The plurality of semiconductor layers 108 can also comprise a high resistivity buffer layer (not explicitly shown)

formed on the nucleation layer. The buffer layer can be made of GaN that is approximately 2 μm thick, with part of the buffer layer doped with iron (Fe). Other materials can also be used for the buffer layer such as doped or undoped layers of Group-III nitride materials with a preferred buffer layer made of a Group-III nitride material such as $Al_xGa_yIn_{(1-x-y)}N$ ($0<=x<=1$, $0<=y<=1$, $x+y<=1$).

A barrier layer 106 can be formed as the top layer of the active region 104. The barrier layer 106 can comprise doped or undoped layers of Group-III nitride materials. The barrier layer can be made of one or multiple layers of $Al_xGa_{1-x}N$, where x ranges from 0-1, and x can be a function of depth such that the barrier layer 106 can be a graded layer. In HEMT embodiments, a two-dimensional electron gas (2DEG) is induced at the heterointerface between the plurality of semiconductors 108 and the barrier layer 106.

Metal source and drain electrodes 110, 112 are formed in contact with the barrier layer 106. Electric current can flow between the source and drain electrodes 110, 112 through the active region 104 when the gate 114 is biased at the appropriate level. The formation of source and drain electrodes 110, 112 is described in detail in the patents and publications referenced above. The source and drain electrodes 110, 112 can be made of different materials including but not limited to alloys of titanium, aluminum, gold or nickel.

An insulating spacer layer 116, for example a layer of SiN, is applied to the top surface of the barrier layer 106. Openings for the gate 114 are then etched into the spacer layer 116. The layers comprising the gate 114 are then deposited by e-beam evaporation. Other deposition processes might also be used. The gate 114 can be made of different materials as discussed in detail below with reference to FIG. 2. The gate 24 can have many different lengths, with a suitable gate length ranging from 0.1 to 2.0 microns (μm), although other gate lengths can also be used.

As shown in FIG. 1, the spacer layer 116 covers all of the barrier layer 106 between the gate 114 and source and drain electrodes 110, 112. The spacer layer 116 can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof. The spacer layer 116 can be many different thicknesses, with a suitable range of thicknesses being approximately 0.03 μm to 0.5 μm.

Figure 2:
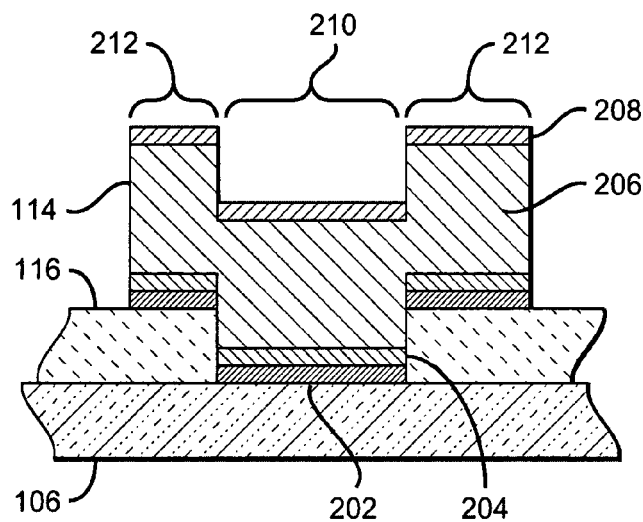
FIG. 2 is a sectional view of one embodiment of the gate of a transistor device according to the present invention.

FIG. 2 shows one embodiment of a gate electrode 114 according to the present invention. Gate electrode 114 is formed on the first spacer layer 116 with a portion of gate 114 contacting barrier layer 106. In this particular embodiment, a contact layer 202 of a nickel-chromium alloy (NiCr) contacts the barrier layer 116. The characteristics of the NiCr contact layer 202 are discussed in detail below. A diffusion barrier 204 is formed on the contact layer 202. A lateral conduction layer 206 is formed on the diffusion barrier 204. A protective layer 208 is formed on the lateral conduction layer 206.

Figure 8:
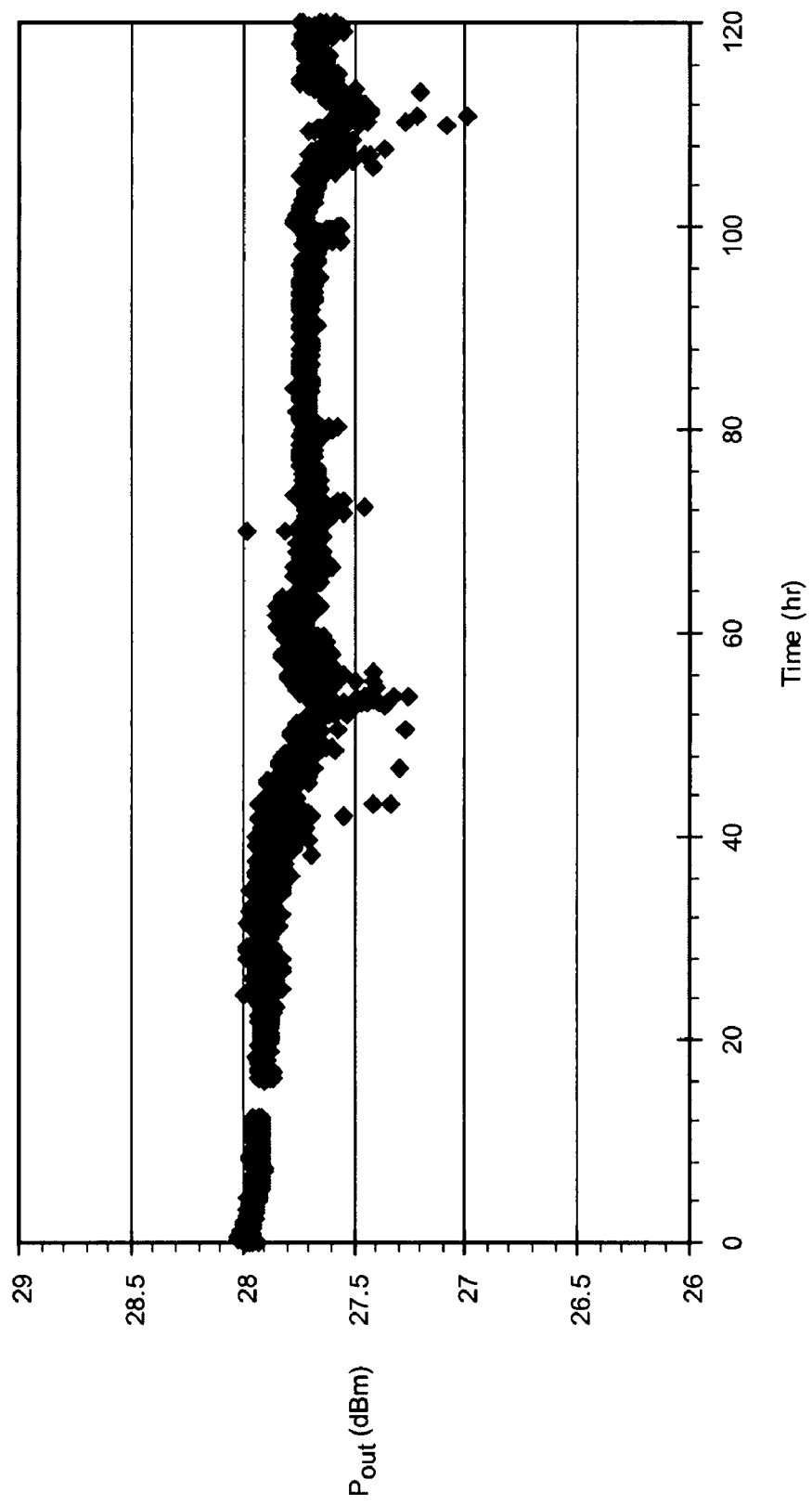
FIG. 8 is a graph of power output versus time for a transistor device having a gate electrode with a NiCr contact portion.

Contact layer 202 directly contacts the barrier layer 106 of the active region. A suitable contact material should have a high Schottky barrier (or a high potential barrier for non-Schottky junctions, such as semiconductor-semiconductor systems) when operating in conjunction with a particular semiconductor system, such as GaN or AlGaN, and should also exhibit durability at high operating voltages and temperatures. Several materials meet these criteria when used with the Group-III nitride systems, including but not limited to Pt, W, Mo, Cr, InN, and various NiCr alloys. A preferred contact layer material is NiCr, with 80% Ni by weight and 20% Cr by weight. NiCr (80-20 wt %) is the preferred source material that can be used in the process whereby the contact layer 202 is formed on the device. The actual composition of the material comprising the contact layer 202 that is formed may vary from the composition of the source material. For example, an NiCr (80-20 wt %) source material can yield a contact layer that has a composition of NiCr (50-50 wt %). NiCr (80-20 wt %) has both the high Schottky barrier associated with Ni (in the Group-III Nitride systems) and the high-temperature durability of Cr. When used in conjunction with GaN, a contact layer formed with NiCr (80-20 wt %) has an approximate barrier height of 0.51 eV. The barrier height is increased to 0.6-1 eV on an AlGaN HEMT and sustained a degradation in output power of 0.3 dB when operating at a junction temperature of 340° C. for 120 hours as shown in FIG. 8 (discussed below). In the embodiment shown in FIG. 2, the NiCr contact layer is approximately 20 nm thick; however, other thicknesses may be used in the range of 5-1000 nm.

Diffusion barrier 204 separates the contact layer 202 from the lateral conduction layer 206. The purpose of the diffusion barrier 204 is to prevent or retard the inter-diffusion of the contact layer 202 and the lateral conduction layer 206. The ideal diffusion barrier is inert with respect to the materials that it separates. In this embodiment, the diffusion barrier 204 comprises a layer of Pt. Other materials including, for example, W, Mo, Ir, Ni and Cr, may be used as diffusion barriers depending on the metals that are to be separated. Diffusion layer 204 is shown having an approximate thickness of 30 nm; however, other thicknesses may be used, typically in the range of 10-100 nm.

Lateral conduction layer 206 is formed on diffusion barrier 204. The lateral conduction layer conducts current from one end of the device 100 to the other. Because FIG. 2 shows a cross section of the device, the direction of the current flow through the lateral conduction layer 206 is primarily in a direction normal to plane of the cross section (i.e., coming out of the paper). The lateral conduction layer 206 should have a high conductivity and sufficient thickness to facilitate current flow. Although FIG. 2 shows a lateral conduction layer 206 comprising Au, any material which has a high conductivity may be used, taking into account the adjacent materials. Lateral conduction layer 206 is shown having a thickness of 400 nm; however, other thicknesses may be used, typically in the range of 100-2000 nm.

Protective layer 208 is formed on lateral conduction layer 206. Protective layer 208 may be necessary to shield the lateral conduction layer 206 from processes that could damage it. In some embodiments the device is treated with corrosive or otherwise damaging processes. For example, a device may be treated using a dry etch process. A protective layer 208 may be used to shield the lateral conduction layer 206. Materials such as nickel, for example, are suitable for this purpose. Other materials that are resistant to ion bombardment and other treatment processes may be used as well. Protective layer 208 is shown in FIG. 2 as having a thickness of 30 nm; however, other thicknesses may be used, typically in the range of 10-100 nm.

The gate 114 is shown in FIG. 2 as having a split-level structure. The middle region 210 of the gate 114 contacts the barrier layer 106 and the outer regions 212 on either side of the center region are disposed on the spacer layer. The structure of this particular embodiment is such that the outer regions 212 can function as field plate structures. Field plates are discussed in more detail below.

Figure 3:
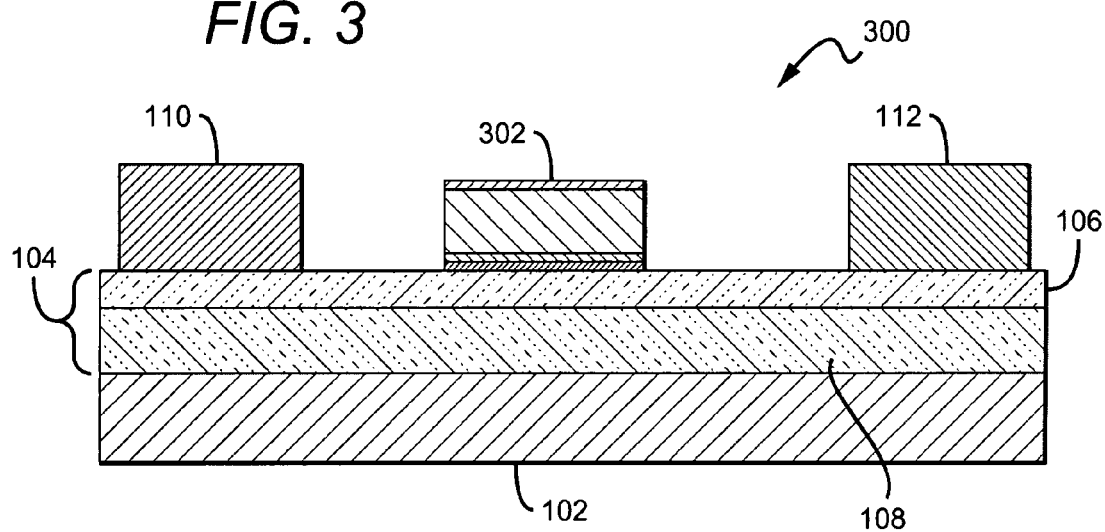
FIG. 3 is a sectional view of one embodiment of a transistor device according to the present invention.

The gate contact structure and composition as disclosed above can be used for many different purposes in a variety of devices. For example, FIG. 3 shows an embodiment of a transistor device 300 according to the present invention. The device 300 has a similar structure as device 100 and shares some common elements that are described above including source electrode 110, drain electrode 112, active region 104, barrier layer 106, plurality of semiconductor layers 108 and substrate 102. One difference is the structure of the gate 302. The gate does not have the split-level structure. Rather, the entire gate 302 is disposed on the barrier layer 106. This embodiment does not include a spacer layer. Otherwise, the device 300 functions similarly as the device 100. The gate 302 has the same layered structure as gate 114 (as shown in FIG. 2), comprising a contact layer, a diffusion barrier, a lateral conduction layer and a protective layer.

Figure 4:
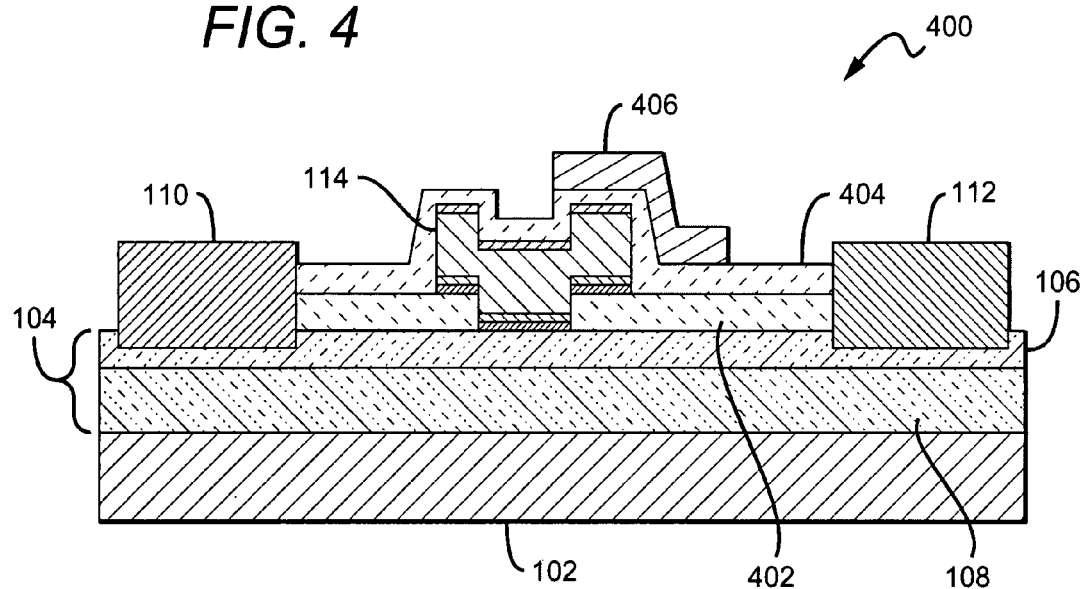
FIG. 4 is a sectional view of one embodiment of a FET according to the present invention.

FIG. 4 shows an embodiment of a FET device 400 according to the present invention. Device 400 is similar to transistor device 100, comprising many of the same features that are described above including substrate 102, active region 104, barrier layer 106, plurality of semiconductor layers 108, source electrode 110, drain electrode 112 and gate electrode 114. This particular embodiment includes first and second spacer layers 402, 404 and a field plate 406. After the epitaxial layers are grown, a first insulating spacer layer 402 is applied to the top surface of the barrier layer 106. The spacer layer 402 may comprise SiN or other suitable non-conductive materials as mentioned above. Openings for the gate 114 are then etched into the first spacer layer 402, and the gate 114 is then deposited. A second insulating spacer layer 404 comprising SiN, for example, or another suitable material is then deposited, covering the gate 114 and at least part of the surface of the first spacer layer 402. Field plate 406 is then deposited on the second spacer layer 404. A typical composition for the field plate 406 is Ni/Au/Ni; however other materials may also be used. The field plate 406 may be connected to either the source electrode 110 or the gate electrode 114. As discussed above, the field plate 406 operates to reduce field concentrations within the device, improving performance and the operating lifetime of the device.

Figure 5:
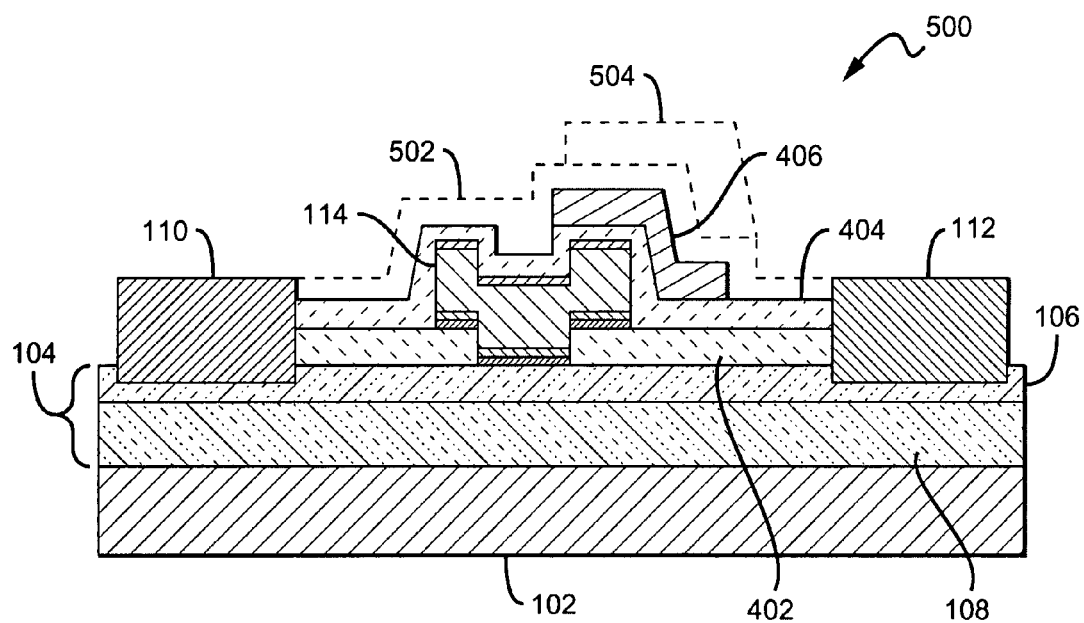
FIG. 5 is a sectional view of one embodiment of a FET according to the present invention.

FIG. 5 shows another embodiment of a FET device 500 according to the present invention. The device 500 functions similarly as device 400 and shares several common elements that are described above including substrate 102, active region 104, barrier layer 106, plurality of semiconductor layers 108, source electrode 110, drain electrode 112, gate electrode 114, first and second spacer layers 402, 404 and field plate 406. This particular embodiment includes an additional spacer layer 502 and field plate 504. Field plate 504 serves to further reduce the electric field at specific points inside the device 500. In FIG. 5, spacer layer 502 and field plate 504 are shown as hashed elements to indicate that the elements are optional. In fact, additional spacer layer/field plate pairs can be included as needed. Each additional field plate may be separated from the previous field plate by an additional spacer layer.

Figure 6:
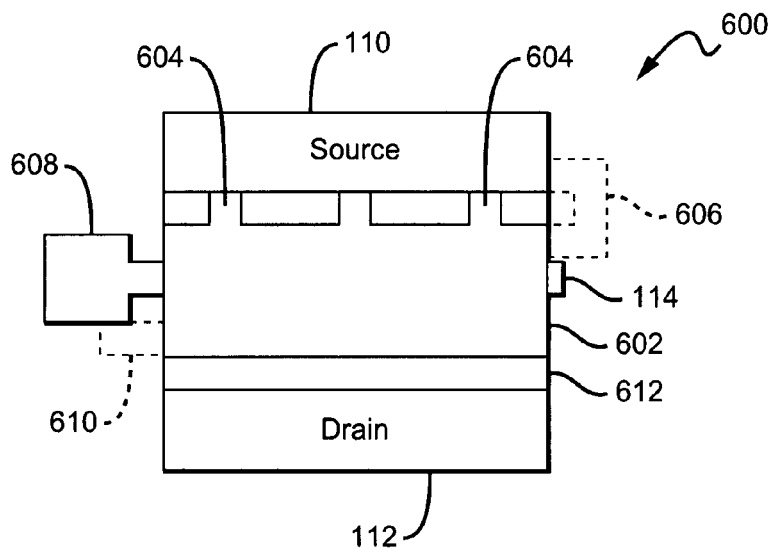
FIG. 6 is a plan view of the top side of a transistor device according to the present invention.

FIG. 6 shows a top-side view of one embodiment of a FET device 600 according to the present invention. The field plate 602 can be electrically connected to either the source electrode 110 or the gate 114. FIG. 6 shows one embodiment according to the present invention wherein the field plate 602 is connected to the source electrode 110, with two alternative connection structures being shown. First conductive buses 604 can be formed on the spacer layer 612 to extend between the field plate 602 and the source electrode 110. Different numbers of buses can be used although the more buses that are used, the greater the unwanted capacitance that can be introduced by the buses. The buses 604 should have a sufficient number so that current effectively spreads between the source electrode 110 and the field plate 602, while covering as little of the FET active region as possible. A suitable number of buses 604 can be three as shown in FIG. 6.

The field plate 602 can also be electrically connected to the source electrode 110 through a conductive path 606 that runs outside of the active region of the FET 600 and is connected to the source electrode 110. As shown in FIG. 6, the path 606 runs outside the active area of the FET 600 at the edge opposite the gate contact 608. In alternative embodiments according to the present invention, the conductive path could run outside the active area of the FET on the side of the gate contact 608, or the FET 600 could include two or more conductive paths running on one or both sides of the FET 600. In one embodiment, the conductive paths 604, 606 can be made of the same material as the source electrode 110 and in other embodiments they can be made of a different material and can be formed at a different step in the fabrication process after formation of the source electrode 110.

The field plate 602 can also be electrically connected to the gate 114 by many different methods, with two suitable methods described herein. First, the field plate can be connected to the gate 114 by a second conductive path 610 that runs outside of the active region of the FET 600 between the field plate 602 and gate 114. The conductive path 610 can connect to the gate contact 608 or a portion of the gate 114 outside of the FET active region, such as the portion of the gate 114 opposite the gate contact 608. Alternatively, more than one conductive path can be used to connect the field plate 602 and gate 114.

An alternative connection structure comprises conductive paths in the form of conductive vias (not shown), which can be formed running from the first field plate 602 to the gate 114, through the spacer layer 612. The vias provide an electrical connection between the gate 114 and first field plate 602 and the vias can be formed by first forming holes in the spacer layer 612, such as by etching, and then filling the holes with a conductive material either in a separate step or during formation of the field plate 602. The vias can be arranged periodically down the first field plate 602 to provide for effective current spreading from the gate 114 to the field plate 602.

Figure 7:
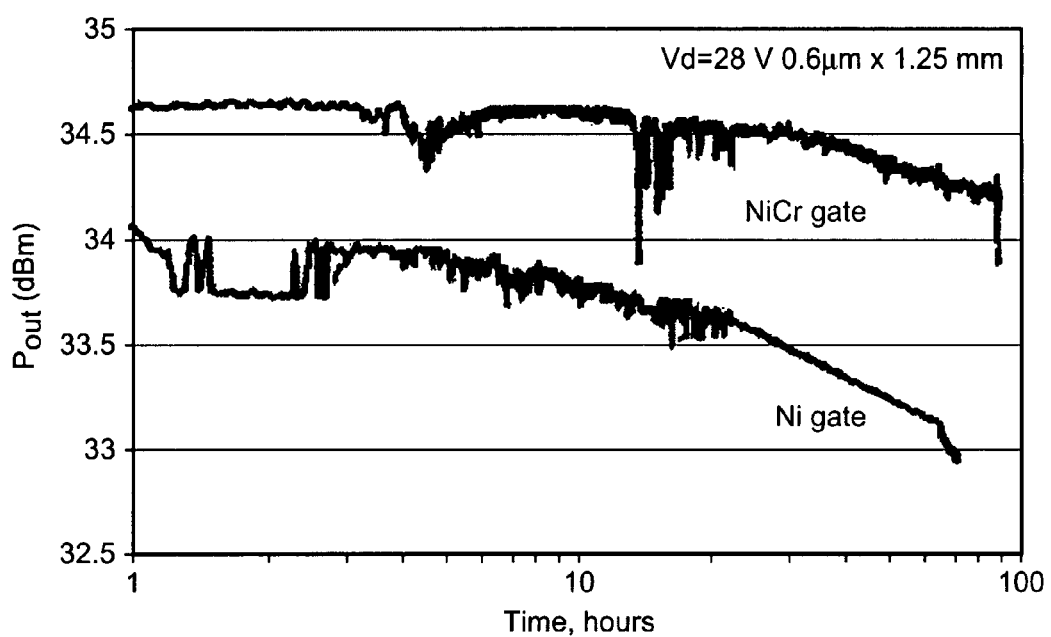
FIG. 7 is a graph power output versus time for two different gate materials.

FIG. 7 shows a graph detailing the results of an experiment testing the degradation of a transistor device having NiCr (80-20 wt %) as the contact layer and a transistor device having a typical contact layer material such as Ni. The graph plots power output ($P_{out}$) of the devices in dBm versus time in hours. Both devices were biased with 28V and heated, resulting in an estimated junction temperature of approximately 350° C. for close to 100 hours. After stressing the device under the specified conditions, the graph shows the device with the NiCr contact layer sustained a drop in power output of approximately 0.25 dBm. The device having the Ni contact layer sustained a drop in power output of more than 1 dBm after stressing.

FIG. 8 is a graph of empirical data resulting from an experiment testing the degradation over time of a transistor device having NiCr (80-20 wt %) as the contact layer. The device had approximate dimensions of 0.6 μm in length and 246 μm in width. The graph plots the power output ($P_{out}$) in dBm versus time in hours. The device was biased with a drain voltage of approximately 28V and heated. The base plate temperature was approximately 310° C., resulting in a junction temperature close to 340° C. The device was heated for 120 hours with the $P_{out}$ being sampled every two minutes. The test was conducted at 4 GHz with a compression level of 3 dB. The data indicate that after being stressed under the specified conditions for 120 hours the device sustained a drop in $P_{out}$ of less than 0.5 dBm.

Although the present invention has been described in detail with reference to certain preferred configurations thereof, other versions are possible. Therefore, the spirit and scope of the invention should not be limited to the versions described above.

We claim:

1. A transistor device, comprising:
   an active region comprising a plurality of gallium nitride (GaN) based semiconductor layers;
   a source electrode electrically coupled with said active region;
   a drain electrode electrically coupled with said active region;
   a gate electrode on said active region between said source and drain electrodes, said gate comprising a contact portion comprising a nickel-chromium alloy (NiCr) portion such that said contact portion has a high Schottky barrier and exhibits low degradation at high operating temperatures, said contact portion electrically coupled with said active region, said NiCr portion disposed on a surface of said gate electrode adjacent to said semiconductor layers; and
   at least one spacer layer on at least part of the surface of said active region between said source and drain electrodes.

2. The transistor device of claim 1, wherein said NiCr portion comprises more than zero percent (0%) chromium and not more than ninety percent (90%) chromium.

3. The transistor device of claim 1, wherein said NiCr portion comprises approximately eighty percent (80%) nickel by weight and approximately twenty percent (20%) chromium by weight.

4. The transistor device of claim 1, wherein said NiCr portion comprises approximately fifty percent (50%) nickel by weight and approximately fifty percent (50%) chromium by weight.

5. The transistor device of claim 1, wherein said NiCr portion has a thickness of not less than 5 nm and not more than 100 nm.

6. The transistor device of claim 1, wherein said NiCr portion has a thickness of approximately 20 nm.

7. The transistor device of claim 1, wherein said transistor device comprises a gallium nitride (GaN) based high electron mobility transistor (HEMT).

8. The transistor device of claim 1, wherein said at least one spacer layer comprises an insulating silicon nitride (SiN) layer.

9. The transistor device of claim 1, said gate electrode further comprising:
   a diffusion barrier on said contact portion, such that said contact portion is interposed between said diffusion barrier and said active region;
   a lateral conduction layer on said diffusion barrier; and
   a protective layer on said lateral conduction layer.

10. The transistor device of claim 9, wherein said diffusion barrier has a thickness of not less than 10 nm and not more than 100 nm.

11. The transistor device of claim 9, wherein said diffusion barrier has a thickness of approximately 30 nm.

12. The transistor device of claim 9, wherein said lateral conduction layer comprises gold (Au).

13. The transistor device of claim 9, wherein said protective layer comprises nickel (Ni).

14. The transistor device of claim 9, wherein said lateral conduction layer has a thickness of not less than 100 nm and not more than 2000 nm.

15. The transistor device of claim 9, wherein said lateral conduction layer has a thickness of approximately 400 nm.

16. The transistor device of claim 9, wherein said protective layer has a thickness of not less than 10 nm and not more than 100 nm.

17. The transistor device of claim 9, wherein said protective layer has a thickness of approximately 30 nm.

18. The transistor device of claim 9, wherein said plurality of active semiconductor layers are formed on a substrate.

19. A field effect transistor (FET), comprising:
   an active region comprising a plurality of gallium nitride (GaN) based semiconductor layers;
   drain and source electrodes coupled with said active region;
   a gate electrode on said active region between said source and drain electrodes, said gate comprising a contact portion comprising a nickel-chromium alloy (NiCr) portion such that said contact portion has a high Schottky barrier and exhibits low degradation at high operating temperatures, said contact portion coupled with said active region, said NiCr portion disposed on a surface of said gate electrode adjacent to said active region;
   first and second spacer layers, said first spacer layer covering at least part of the surface of said active region, said second spacer layer covering said gate electrode and at least part of said first spacer layer; and
   a field plate on said second spacer layer.

20. The FET of claim 19, wherein said NiCr portion comprises more than zero percent (0%) chromium and not more than ninety percent (90%) chromium.

21. The FET of claim 19, wherein said NiCr portion comprises approximately eighty percent (80%) nickel by weight and approximately twenty percent (20%) chromium by weight.

22. The FET of claim 19, wherein said NiCr portion comprises approximately fifty percent (50%) nickel by weight and approximately fifty percent (50%) chromium by weight.

23. The FET of claim 19, wherein said NiCr portion has a thickness of not less than 5 nm and not more than 100 nm.

24. The FET of claim 19, wherein said NiCr portion has a thickness of approximately 20 nm.

25. The FET of claim 19, wherein said field plate is connected to said gate electrode.

26. The FET of claim 19, wherein said field plate is connected to said source electrode.

27. The FET of claim 19, said gate electrode further comprising:
   a diffusion barrier on said contact portion, such that said contact portion is interposed between said diffusion barrier and said active region;
   a lateral conduction layer on said diffusion barrier; and
   a protective layer on said lateral conduction layer.

* * * * *